United States Patent
Ye

(10) Patent No.: US 11,195,887 B2
(45) Date of Patent: Dec. 7, 2021

(54) TOUCH CONTROL PANEL AND MANUFACTURING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventor: Jian Ye, Hubei (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 38 days.

(21) Appl. No.: 16/847,837

(22) Filed: Apr. 14, 2020

(65) Prior Publication Data

US 2021/0159280 A1 May 27, 2021

(30) Foreign Application Priority Data

Nov. 26, 2019 (CN) .......................... 201911169728.6

(51) Int. Cl.
*H01L 27/32* (2006.01)
*H01L 51/56* (2006.01)
*H01L 51/52* (2006.01)
*H01L 51/50* (2006.01)

(52) U.S. Cl.
CPC ........ *H01L 27/323* (2013.01); *H01L 27/3244* (2013.01); *H01L 51/5012* (2013.01); *H01L 51/5237* (2013.01); *H01L 51/56* (2013.01); *H01L 2251/301* (2013.01)

(58) Field of Classification Search
CPC ............. H01L 2251/301; H01L 27/323; H01L 27/3244; H01L 51/5012; H01L 51/5237; H01L 51/56
See application file for complete search history.

(56) References Cited

U.S. PATENT DOCUMENTS

2018/0040672 A1* 2/2018 Park ...................... G06F 1/1643

* cited by examiner

*Primary Examiner* — Afroza Chowdhury
(74) *Attorney, Agent, or Firm* — The Roy Gross Law Firm, LLC; Roy Gross

(57) ABSTRACT

The present invention provides a touch control panel and a manufacturing method thereof. The present invention, by arranging an insulating layer with elastic modulus different from an adjacent inorganic layer or organic layer between a first metal layer and a second metal layer, makes their contact surfaces uneven. When light emitted by an electroluminescent (EL) layer reaches the uneven contact surfaces, refraction of different angles occurs, thereby increasing a viewing angle range of organic light-emitting diodes (OLEDs).

9 Claims, 4 Drawing Sheets

TOUCH CONTROL PANEL AND MANUFACTURING METHOD THEREOF

FIELD OF INVENTION

The present invention relates to the field of display technology, and especially to a touch control panel and a manufacturing method thereof.

BACKGROUND OF INVENTION

Flexible organic light-emitting diode (OLED) displays have advantages such as self-luminescence, wide color gamut, high brightness, quick response times, low power consumption, bendable structures, etc., and have become increasingly popular in the market, gradually replacing liquid crystal displays (LCDs) to become a mainstream of display technology.

Flexible OLEDs are divided into two categories of top emission and bottom emission according to their light-emitting position. Currently, top emission is the mainstream of OLED mass production technology. It has a bottom-up structure that sequentially includes a thin-film transistor (TFT) array substrate, an anode layer, a pixel defining layer (PDL), an electroluminescent (EL) layer, a cathode layer, a thin-film encapsulation (TFE) layer, and a polarizer (POL). Light emitted by an electroluminescent layer in a top emission OLED device is reflected upward by an anode layer at the bottom (anodes are usually made of ITO/Ag/ITO), penetrates a cathode layer, a TFE layer, and a polarizer, and then emits from the top.

Light emitted by the EL layer passing the anode layer at a bottom of the EL layer is usually linearly emitted upward, and therefore its viewing angles of brightness/chromaticity are usually limited. That is, with a viewing angle gradually increasing, brightness of OLED displays experiences attenuation to a certain degree, and chromaticity experiences deviation to a certain degree.

Furthermore, OLED displays used by smartphones have a necessary touch control function, and therefore integrating a touch sensing unit on an OLED display has become an inevitable trend. Besides, in order to facilitate development of foldable smartphones in the future, touch sensing units having a metal mesh with favorable flexibility have become a first-priority choice of touch control displays. However, if a metal mesh touch sensing unit is integrated on the OLED display, a viewing angle range of the OLED display will inevitably be further affected, particularly by a light-shading property of metal meshes.

Therefore, how to further increase the viewing angle range of OLED displays so that good quality images can still be presented when observing at wider viewing angles from a side has become a key point of researches.

SUMMARY OF INVENTION

An embodiment of the present invention provides a touch control panel and a manufacturing method thereof. By arranging an insulating layer between a first metal layer and a second metal layer whose elastic modulus different from an adjacent inorganic layer or organic layer, their contact surface is made lumpy. When light emitted by an EL layer reaches the lumpy contact surface, refraction of different angles occurs, which thereby increases a range of viewing angles of OLEDs.

According to an aspect of the present invention, the present invention provides a touch control panel that includes an inorganic layer; a first metal layer disposed on the inorganic layer; an insulating layer disposed on the first metal layer; a second metal layer disposed on the insulating layer; and an organic layer disposed on the second metal layer; wherein an elastic modulus of the insulating layer is different from an elastic modulus of the inorganic layer, or the elastic modulus of the insulating layer is different from an elastic modulus of the organic layer, or the elastic modulus of the insulating layer is different from the elastic modulus of the inorganic layer and the elastic modulus of the organic layer.

Furthermore, the inorganic layer is made of a material including at least one of silicon nitride, silicon oxynitride, silicon carbonitride, and silica.

Furthermore, the insulating layer is made of a material comprising at least one of silicon nitride, silicon oxynitride, silicon carbonitride, silica, and acrylic.

Furthermore, the first metal layer and the second metal layer are made of a material comprising at least one of titanium, aluminum, molybdenum, and silver.

Furthermore, the organic layer is made of a material comprising at least one of acrylic, hexamethyldisiloxane, and silyl compounds.

According to another aspect of the present invention, the present invention provides a manufacturing method for a touch control panel that includes the following steps: providing an organic light-emitting diode (OLED) display panel, wherein the OLED display panel comprises a thin film transistor backplane; providing an electroluminescent (EL) layer on the thin film transistor backplane; providing an encapsulation layer on the EL layer, and forming an inorganic layer on the encapsulation layer; forming a first metal layer on the inorganic layer; forming an insulating layer on the first metal layer, and forming at least one via on the insulating layer; forming a second metal layer on the insulating layer; and forming an organic layer on the second metal layer.

Furthermore, an elastic modulus of the insulating layer is different from an elastic modulus of the inorganic layer, or the elastic modulus of the insulating layer is different from an elastic modulus of the organic layer, or the elastic modulus of the insulating layer is different from the elastic modulus of the inorganic layer and the elastic modulus of the organic layer.

Furthermore, in the step of forming an insulating layer on the first metal layer and forming at least one via on the insulating layer, the at least one via is formed at a position on the insulating layer and corresponding to an end point of the first metal layer through exposure and etching processes.

Furthermore, the end points and a pixel unit in the EL layer are staggered to each other in a vertical direction.

Furthermore, the second metal layer is electrically connected to the first metal layer through the at least one via.

An embodiment of the present invention, by arranging an insulating layer with elastic modulus different from an adjacent inorganic layer or organic layer between a first metal layer and a second metal layer, makes their contact surfaces uneven. When light emitted by an EL layer reaches the uneven contact surfaces, refraction of different angles occurs, thereby increasing a viewing angle range of OLEDs.

DESCRIPTION OF DRAWINGS

With reference to the following drawings, the technical approach and the beneficial effects of the present invention will be obvious through describing embodiments of the present invention in detail.

DETAILED DESCRIPTION OF PREFERRED EMBODIMENTS

Figure 1:
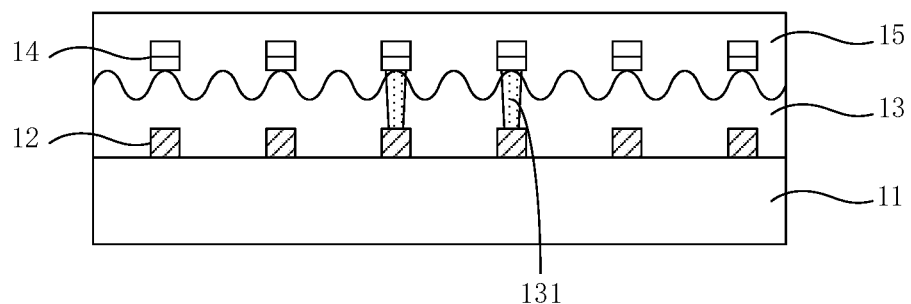
FIG. 1 is a structural schematic diagram of a touch control panel according to an embodiment of the present invention.

The embodiments of the present invention are described in detail hereinafter. Examples of the described embodiments are given in the accompanying drawings. It should be noted that the following embodiments are intended to illustrate and interpret the present invention, and shall not be construed as causing limitations to the present invention. Similarly, the following embodiments are part of the embodiments of the present invention and are not the whole embodiments, and all other embodiments obtained by those skilled in the art without making any inventive efforts are within the scope protected by the present invention.

Terms such as "first", "second", "third", etc. (if they exist) in the specification, claim and above-mentioned drawings of the present invention are used herein for purposes of description and are not intended to indicate or imply relative order or significance. It should be understood that elements described by such terms can be switched under proper conditions. Besides, terms such as "include", "comprise" and any their variations are intended for a non-exclusive meaning.

In detailed description of preferred embodiments, drawings described below and embodiments used to describe principles of the present invention are only for explanation, and are not interpreted to limit scope of the present invention. A person of ordinary skill in the art will understand principles of the present invention can be realized in any suitably arranged systems. Illustrative embodiments are described in detail by illustrating practical cases in drawings. Furthermore, Illustrative embodiments are described in detail with reference to drawings. Identical reference numerals in drawings indicate identical elements.

Terms used in the detailed description of preferred embodiments are used only to describe specific embodiments, and are not intended to show concepts of the present invention. Unless with clearly different meanings in the context, expressions in singular forms cover expressions in plural forms. In the specification of the present invention, it should be understood that terms such as "include", "have", "comprise", etc. are intended to describe possibilities of features, numbers, steps, processes or combinations thereof disclosed in the specification of the present invention, and are not intended to exclude possibilities of existing or adding of one or more other features, numbers, steps, processes or combinations thereof. Identical reference numerals in drawings indicate identical elements.

Referring to FIG. 1, an embodiment of the present invention provides a touch control panel that includes an inorganic layer 11, a first metal layer 12, an insulating layer 13, vias 131, a second metal layer 14, and an organic layer 15.

Specifically, material of the inorganic layer 11 includes but is not limited to silicon nitride, silicon oxynitride, silicon carbonitride, and silica.

The first metal layer 12 is disposed on the inorganic layer 11. Material of the first metal layer 12 includes but is not limited to titanium, aluminum, molybdenum, and silver. The first metal layer 12 can be a metal bridge that avoids a pixel unit of an organic light-emitting diode (OLED) display panel to prevent display effect of the display panel from being affected.

The insulating layer 13 is disposed on the first metal layer 12. The insulating layer 13 is made of inorganic compounds that include but are not limited to silicon nitride, silicon oxynitride, silicon carbonitride, and silica. At least one via 131 is defined on the insulating layer 13.

The second metal layer 14 is disposed on the insulating layer 13. Material of the second metal layer 14 includes but is not limited to titanium, aluminum, molybdenum, and silver. The second metal layer 14 is configured to arrange driving electrodes and sensing electrodes. The first metal layer 12 and the second metal layer 14 form a metal mesh. Wherein, a broken driving electrode and sensing electrode are connected to the first metal layer 12 through a via 131, and the driving electrode and sensing electrode avoid the pixel unit of the OLED display panel to prevent display effect of the display panel from being affected.

The organic layer 15 is disposed on the second metal layer 14. Material of the organic layer includes but is not limited to acrylic, hexamethyldisiloxane, and silyl compounds.

In an embodiment of the present invention, an elastic modulus of the insulating layer 13 is different from an elastic modulus of the organic layer 15. Specifically, the elastic modulus of the insulating layer 13 is greater than the elastic modulus of the organic layer 15. Differences in elastic moduli make their contact surface uneven. When light emitted by an electroluminescent (EL) layer reaches the uneven contact surface, refraction of different angles occurs, thereby increasing a viewing angle range of OLEDs.

Wherein, the elastic modulus can be regarded as an indicator that measures a degree of difficulty of elastic deformation of materials. The greater the value is, the greater the stress required to make a material undergo a certain deformation, which means rigidity of the material is greater; that is, when applying a certain stress, elastic deformation that occurs is less. A greater value of an elastic modulus means a greater stress and a greater rigidity of a material, and higher difficulty for deformation. A smaller value of an elastic modulus means lower stress and lower rigidity of a material, and greater ease for deformation.

Figure 2:
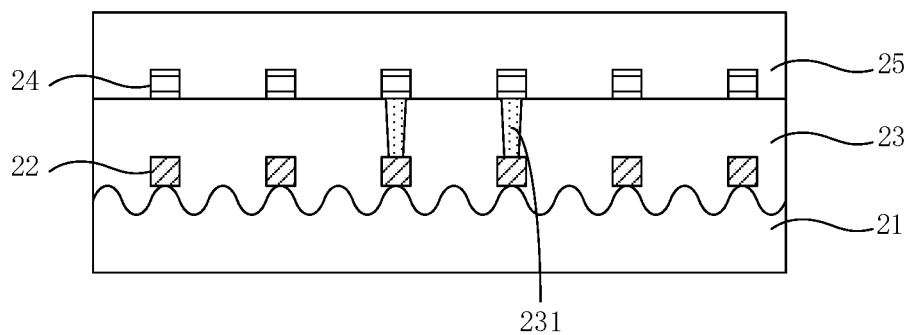
FIG. 2 is a structural schematic diagram of a touch control panel according to another embodiment of the present invention.

Referring to FIG. 2, another embodiment of the present invention provides a touch control panel that includes an inorganic layer 21, a first metal layer 22, an insulating layer 23, vias 231, a second metal layer 24, and an organic layer 25.

Specifically, material of the inorganic layer 21 includes but is not limited to silicon nitride, silicon oxynitride, silicon carbonitride, and silica.

The first metal layer 22 is disposed on the inorganic layer 21. Material of the first metal layer 22 includes but is not limited to titanium, aluminum, molybdenum, and silver. The first metal layer 22 can be a metal bridge that avoids a pixel unit of an OLED display panel to prevent display effect of the display panel from being affected.

The insulating layer 23 is disposed on the first metal layer 22. The insulating layer 23 is made of organic compounds or inorganic compounds that have a lower elastic modulus, including but not limited to acrylic. At least one via 231 is defined on the insulating layer 23.

The second metal layer 24 is disposed on the insulating layer 23. Material of the second metal layer 24 includes but is not limited to titanium, aluminum, molybdenum, and silver. The second metal layer 24 is configured to arrange driving electrodes and sensing electrodes. The first metal layer 22 and the second metal layer 24 form a metal mesh. Wherein, a broken driving electrode and sensing electrode are connected to the first metal layer 22 through a via 231, and the driving electrode and sensing electrode avoid the pixel unit of the OLED display panel to prevent display effect of the display panel from being affected.

The organic layer 25 is disposed on the second metal layer 24. Material of the organic layer includes but is not limited to acrylic, hexamethyldisiloxane, and silyl compounds.

In the present embodiment, an elastic modulus of the insulating layer 23 is different from an elastic modulus of the inorganic layer 21. Specifically, the elastic modulus of the insulating layer 23 is less than the elastic modulus of the inorganic layer 21. Differences in elastic moduli make their contact surface uneven. When light emitted by an EL layer reaches the uneven contact surface, refraction of different angles occurs, thereby increasing a viewing angle range of OLEDs.

Figure 3:
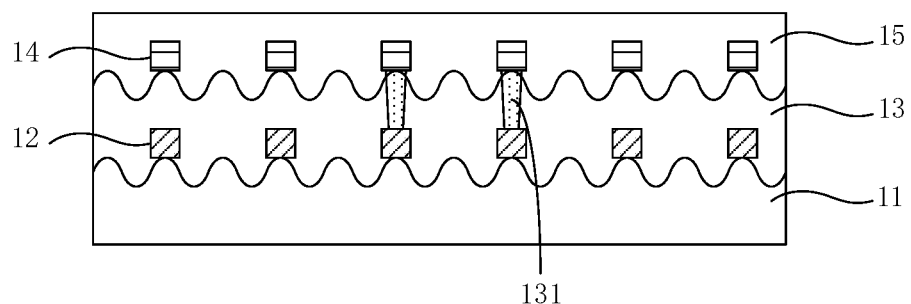
FIG. 3 is a structural schematic diagram of a touch control panel according to still another embodiment of the present invention.

Referring to FIG. 3, still another embodiment of the present invention provides a touch control panel that includes an inorganic layer 31, a first metal layer 32, an insulating layer 33, vias 331, a second metal layer 34, and an organic layer 35.

Specifically, material of the inorganic layer 31 includes but is not limited to silicon nitride, silicon oxynitride, silicon carbonitride, and silica.

The first metal layer 32 is disposed on the inorganic layer 31. Material of the first metal layer 32 includes but is not limited to titanium, aluminum, molybdenum, and silver. The first metal layer 32 can be a metal bridge that avoids a pixel unit of an OLED display panel to prevent display effect of the display panel from being affected.

The insulating layer 33 is disposed on the first metal layer 32. The insulating layer 33 is made of inorganic compounds or organic compounds, including but not limited to silicon nitride, silicon oxynitride, silicon carbonitride, silica, and acrylic. At least one via 331 is defined on the insulating layer 33.

The second metal layer 34 is disposed on the insulating layer 33. Material of the second metal layer 34 includes but is not limited to titanium, aluminum, molybdenum, and silver. The second metal layer 34 is configured to arrange driving electrodes and sensing electrodes. The first metal layer 32 and the second metal layer 34 form a metal mesh. Wherein, a broken driving electrode and sensing electrode are connected to the first metal layer 32 through a via 331, and the driving electrode and sensing electrode avoid the pixel unit of the OLED display panel to prevent display effect of the display panel from being affected.

The organic layer 35 is disposed on the second metal layer 34. Material of the organic layer includes but is not limited to acrylic, hexamethyldisiloxane, and silyl compounds.

In the present embodiment, an elastic modulus of the insulating layer 33 is different from that of the organic layer 35, and an elastic modulus of the insulating layer 33 is also different from that of the inorganic layer 31. Differences in elastic moduli not only make a contact surface of the insulating layer 33 and the organic layer 35 uneven, but also make a contact surface of the insulating layer 33 and the inorganic layer 31 uneven. When light emitted by an EL layer reaches the uneven contact surfaces, refraction of different angles occurs, thereby increasing a viewing angle range of OLEDs.

Figure 4:
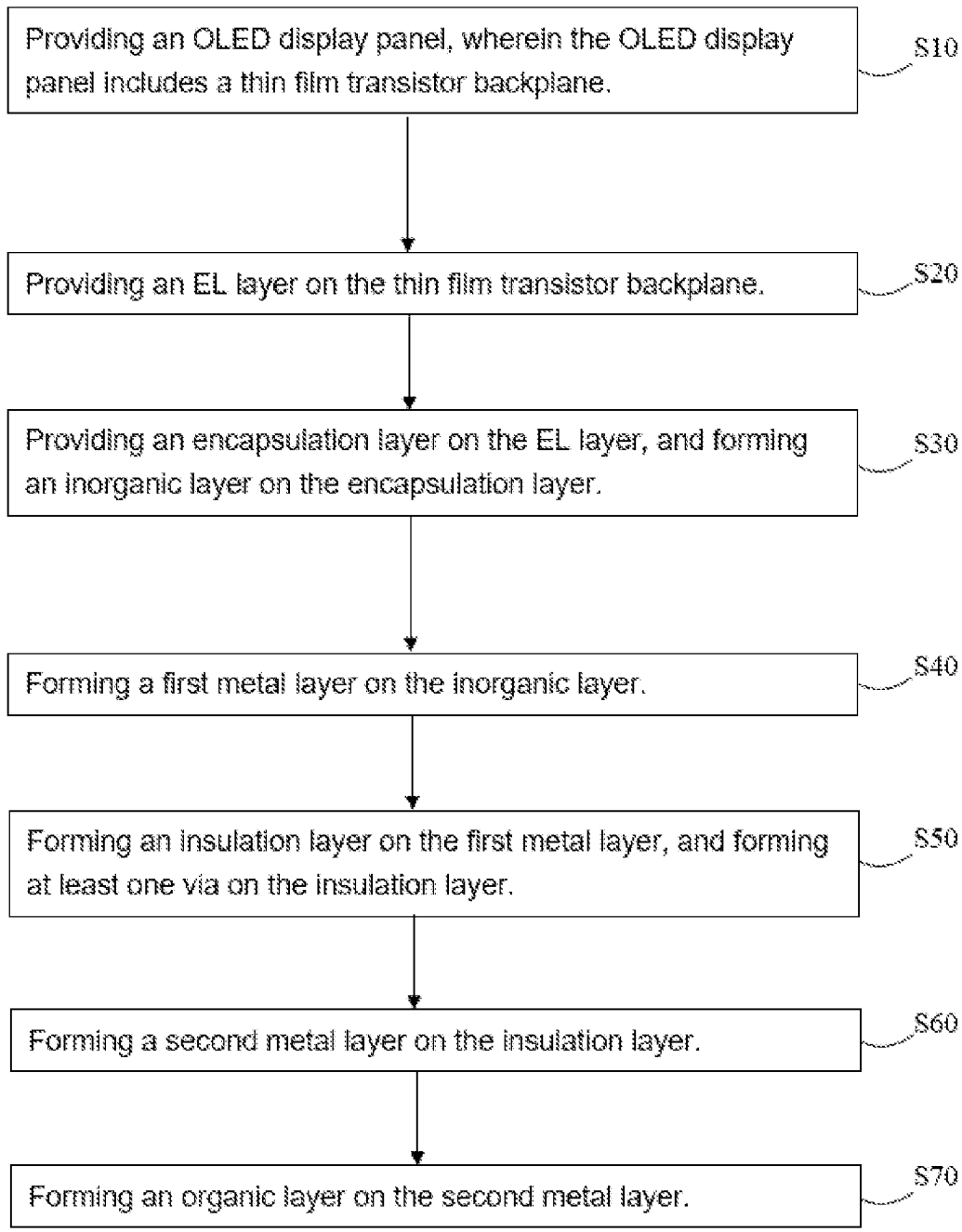
FIG. 4 is a flowchart of steps of a manufacturing method for a touch control panel according to an embodiment of the present invention.

Referring to FIG. 4, an embodiment of the present invention provides a manufacturing method of a touch control panel that includes following steps.

Step S10, providing an OLED display panel, wherein the OLED display panel includes a thin film transistor backplane 46.

Step S20, providing an EL layer 47 on the thin film transistor backplane 46.

Figure 5:
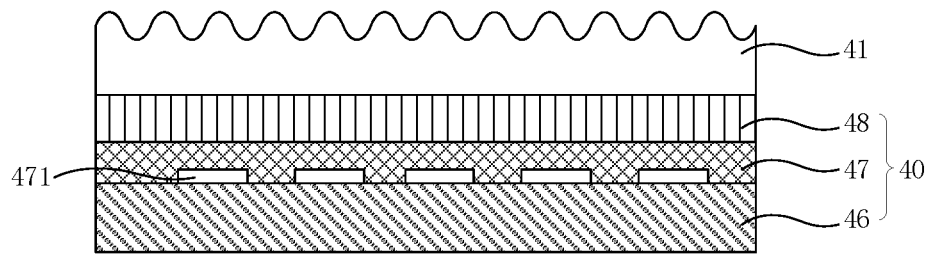
FIG. 5-FIG. 9 are schematic diagrams illustrating processes of a manufacturing method for a touch control panel according to an embodiment of the present invention.

Also referring to FIG. 5, step S30, providing an encapsulation layer 48 on the EL layer 47, and forming an inorganic layer 41 on the encapsulation layer 48.

In the present embodiment, material of the inorganic layer 41 includes but is not limited to silicon nitride, silicon oxynitride, silicon carbonitride, and silica.

Figure 6:
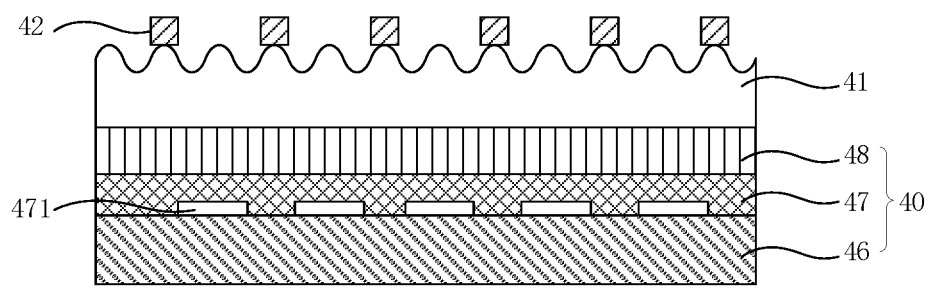

Also referring to FIG. 6, step S40, forming a first metal layer on the inorganic layer.

In the present embodiment, the first metal layer 42 is patterned. Material of the first metal layer 42 includes but is not limited to titanium, aluminum, molybdenum, and silver. The first metal layer 42 can be a metal bridge that avoids a pixel unit 471 of an OLED display panel 40 to prevent display effect of the display panel from being affected.

Figure 7:
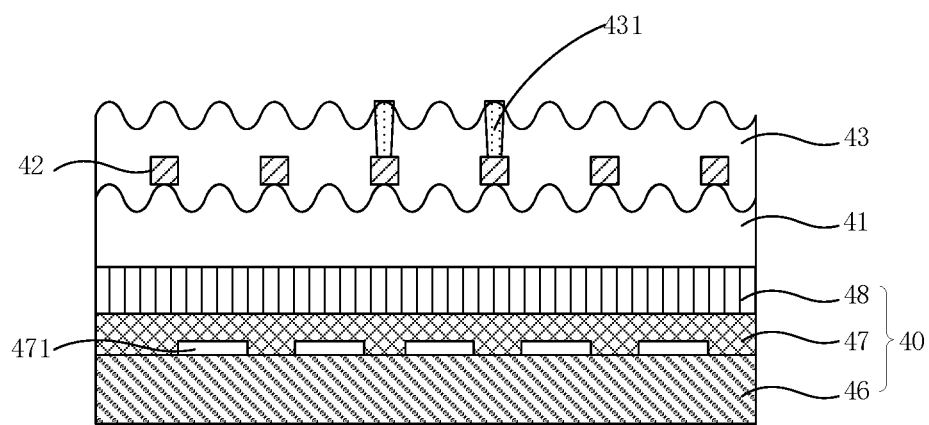

Also referring to FIG. 7, step S50, forming an insulating layer on the first metal layer, and forming at least one via on the insulating layer.

In the present embodiment, the at least one via 431 is formed at a position on the insulating layer 43 corresponding to an end point of the first metal layer 42 through exposure and etching processes. The end points and the pixel unit in the EL layer are staggered from each other in a vertical direction, that is, the end points avoid the pixel unit 471 in the EL layer 47. The insulating layer 33 is made of inorganic compounds or organic compounds, including but not limited to silicon nitride, silicon oxynitride, silicon carbonitride, silica, and acrylic.

Figure 8:
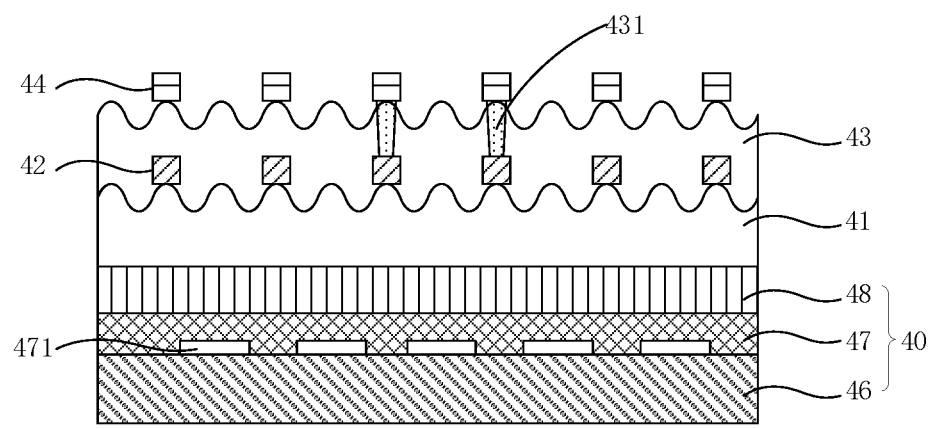

Also referring to FIG. 8, step S60, forming a second metal layer on the insulating layer.

In the present embodiment, the second metal layer 44 is electrically connected to the first metal layer 42 through the at least one via 431. Material of the second metal layer 44 includes but is not limited to titanium, aluminum, molybdenum, and silver. The second metal layer 44 is configured to arrange driving electrodes and sensing electrodes. The first metal layer 42 and the second metal layer 44 form a metal mesh. Wherein, a broken driving electrode and sensing electrode are connected to the first metal layer 42 through a via 431, and the driving electrode and sensing electrode avoid the pixel unit 471 of the OLED display panel 40 to prevent display effect of the display panel from being affected.

Figure 9:
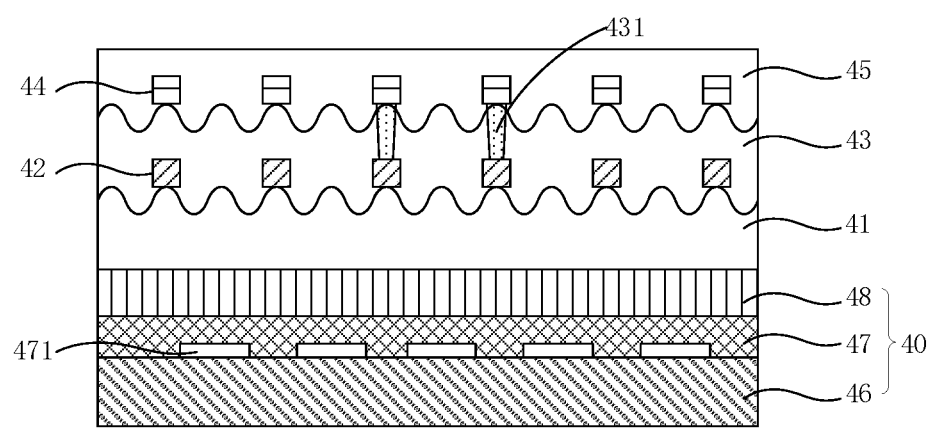

Also referring to FIG. 9, step S70, forming an organic layer on the second metal layer.

In the present embodiment, material of the organic layer includes but is not limited to acrylic, hexamethyldisiloxane, and silyl compounds.

An embodiment of the present invention provides a touch control panel and a manufacturing method thereof. By arranging an insulating layer with elastic modulus different from an adjacent inorganic layer or organic layer between a first metal layer and a second metal layer, their contact surfaces become uneven. When light emitted by an EL layer reaches the uneven contact surfaces, refraction of different angles occurs, thereby increasing a viewing angle range of OLEDs.

Although the present invention has been explained in relation to its preferred embodiment, it does not intend to limit the present invention. It will be apparent to those skilled in the art having regard to this present invention that other modifications of the exemplary embodiments beyond these embodiments specifically described here may be made without departing from the spirit of the invention. Accordingly, such modifications are considered within the scope of the invention as limited solely by the appended claims.

What is claimed is:

1. A touch control panel, comprising:
an inorganic layer;
a first metal layer disposed on the inorganic layer;
an insulating layer disposed on the first metal layer;
a second metal layer disposed on the insulating layer; and
an organic layer disposed on the second metal layer;
wherein an elastic modulus of the insulating layer is different from an elastic modulus of the inorganic layer and an elastic modulus of the organic layer.

2. The touch control panel as claimed in claim 1, wherein the inorganic layer is made of a material comprising at least one of silicon nitride, silicon oxynitride, silicon carbonitride, or silica.

3. The touch control panel as claimed in claim 1, wherein the insulating layer is made of a material comprising at least one of silicon nitride, silicon oxynitride, silicon carbonitride, silica, or acrylic.

4. The touch control panel as claimed in claim 1, wherein the first metal layer and the second metal layer are made of materials comprising at least one of titanium, aluminum, molybdenum, or silver.

5. The touch control panel as claimed in claim 1, wherein the organic layer is made of a material comprising at least one of acrylic, hexamethyldisiloxane, or silyl compounds.

6. A manufacturing method of a touch control panel, comprising following steps:
providing an organic light-emitting diode (OLED) display panel, wherein the OLED display panel comprises a thin film transistor backplane;
providing an electroluminescent (EL) layer on the thin film transistor backplane;
providing an encapsulation layer on the EL layer, and forming an inorganic layer on the encapsulation layer;
forming a first metal layer on the inorganic layer;
forming an insulating layer on the first metal layer, and forming at least one via on the insulating layer;
forming a second metal layer on the insulating layer; and
forming an organic layer on the second metal layer,
wherein an elastic modulus of the insulating layer is different from an elastic modulus of the inorganic layer and an elastic modulus of the organic layer.

7. The manufacturing method as claimed in claim 6, wherein in the step of forming the insulating layer on the first metal layer and forming the at least one via on the insulating layer, the at least one via is formed at a position on the insulating layer corresponding to an end point of the first metal layer through exposure and etching processes.

8. The manufacturing method as claimed in claim 7, wherein the end point and a pixel unit in the EL layer are staggered from each other in a vertical direction.

9. The manufacturing method as claimed in claim 6, wherein the second metal layer is electrically connected to the first metal layer through the at least one via.

* * * * *